United States Patent
Hua et al.

(10) Patent No.: US 10,158,212 B1
(45) Date of Patent: Dec. 18, 2018

(54) STRUCTURE FOR REDUCING COMPOUND SEMICONDUCTOR WAFER DISTORTION

(71) Applicant: WIN Semiconductors Corp., Tao Yuan (TW)

(72) Inventors: Chang-Hwang Hua, Tao Yuan (TW); Wen Chu, Tao Yuan (TW)

(73) Assignee: WIN SEMICONDUCTORS CORP., Tao Yuan (TW)

( * ) Notice: Subject to any disclaimer, the term of this patent is extended or adjusted under 35 U.S.C. 154(b) by 0 days.

(21) Appl. No.: 15/684,482

(22) Filed: Aug. 23, 2017

(30) Foreign Application Priority Data

Jun. 14, 2017 (TW) .............................. 106119865 A

(51) Int. Cl.
| | |
|---|---|
| *H01S 5/00* | (2006.01) |
| *H01S 5/34* | (2006.01) |
| *H01L 23/00* | (2006.01) |
| *H01S 5/042* | (2006.01) |
| *H01L 29/45* | (2006.01) |
| *H01S 5/02* | (2006.01) |
| *H01S 5/187* | (2006.01) |
| *H01S 5/183* | (2006.01) |

(52) U.S. Cl.
CPC .......... *H01S 5/3406* (2013.01); *H01L 23/562* (2013.01); *H01L 29/45* (2013.01); *H01S 5/0206* (2013.01); *H01S 5/0425* (2013.01); *H01S 5/187* (2013.01); *H01S 5/18311* (2013.01); *H01S 5/18344* (2013.01)

(58) Field of Classification Search
CPC .... H01S 5/3406; H01S 5/0206; H01S 5/0425; H01S 5/18311; H01S 5/18344; H01S 5/187; H01L 23/562; H01L 29/45
See application file for complete search history.

(56) References Cited

U.S. PATENT DOCUMENTS

| | | | |
|---|---|---|---|
| 2004/0191534 A1* | 9/2004 | Ravi | H01L 23/3735 428/446 |
| 2012/0138945 A1* | 6/2012 | Chen | H01L 21/76254 257/76 |
| 2015/0004778 A1* | 1/2015 | Botula | H01L 21/04 438/510 |

* cited by examiner

*Primary Examiner* — Armando Rodriguez
(74) *Attorney, Agent, or Firm* — Muncy, Geissler, Olds & Lowe, PC

(57) ABSTRACT

An improved structure for reducing compound semiconductor wafer distortion comprises a contact metal layer, at least one stress balance layer and a die attachment layer. The contact metal layer is formed on a bottom surface of a compound semiconductor wafer; the at least one stress balance layer is formed on a bottom surface of the contact metal layer, wherein the at least one stress balance layer is made of at least one conductive material; the die attachment layer is formed on a bottom surface of the at least one stress balance layer, wherein the die attachment layer is made of conductive material. By locating the at least one stress balance layer between the contact metal layer and the die attachment layer, the stress suffered by the compound semiconductor wafer is balanced so that the distortion of the compound semiconductor wafer is reduced.

13 Claims, 2 Drawing Sheets

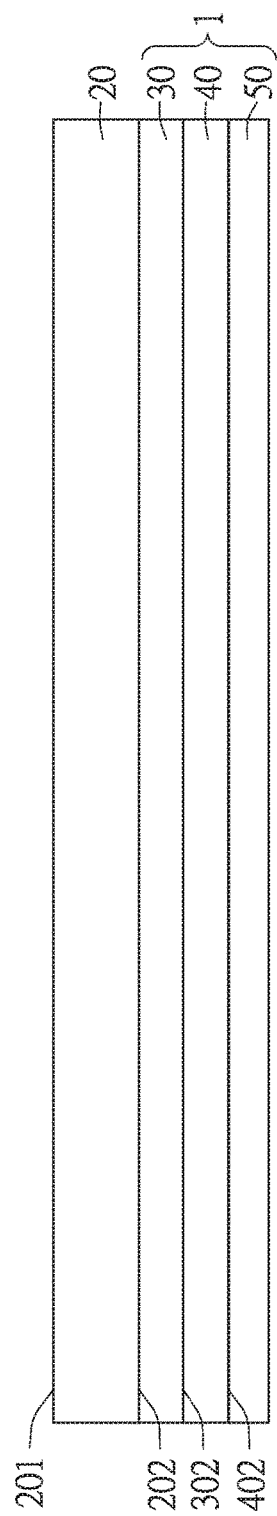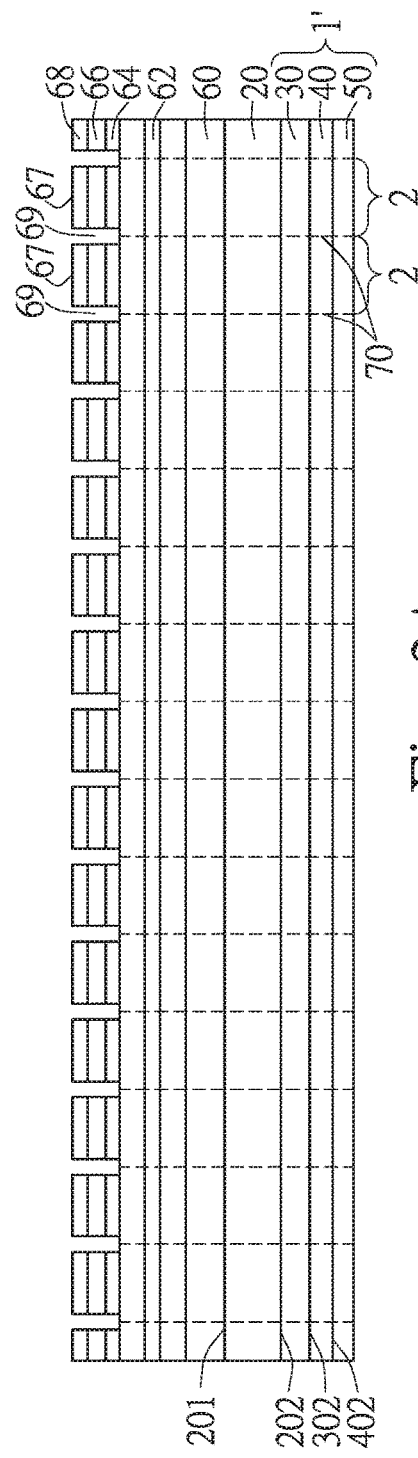

STRUCTURE FOR REDUCING COMPOUND SEMICONDUCTOR WAFER DISTORTION

FIELD OF THE INVENTION

The present invention relates to an improved structure for reducing the distortion of the compound semiconductor wafer, especially an improved structure for balancing the stress suffered by the compound semiconductor wafer.

BACKGROUND OF THE INVENTION

During the process of forming integrated circuits on a compound semiconductor wafer, more or less stress is accumulated such that the compound semiconductor wafer is suffered a stress. In some certain situation, the compound semiconductor wafer is suffered greater stress, such as forming a stressed thin film on the compound semiconductor wafer or growing a stressed epitaxial structure on the compound semiconductor wafer. If the stress suffered by the compound semiconductor wafer cannot be properly balanced, then it will cause bowing distortion of the compound semiconductor wafer. Even further it will crack the edge of the compound semiconductor wafer. Moreover, after the compound semiconductor wafer thinning process, since the compound semiconductor wafer becomes thinner so that it is more difficult for balancing the stress suffered by the compound semiconductor wafer. Therefore, the bowing distortion of the compound semiconductor wafer becomes more serious and even further causes the cracking of the edge of the compound semiconductor wafer.

In terms of the diameters of the compound semiconductor wafers, the bowing distortion of the compound semiconductor wafer caused by the stress is less obvious when the diameter of the compound semiconductor wafer is less than 3 inches, while the bowing distortion of the compound semiconductor wafer caused by the stress is much more significant when the diameter of the compound semiconductor wafer is greater than or equal to 3 inches, such as 4 inches, 5 inches, 6 inches or even greater.

In conventional technology, an improved structure is disclosed for balancing the stress suffered by the silicon semiconductor wafer. Please refer to FIG. 3, which is a sectional schematic view of an improved structure for silicon semiconductor wafer of conventional technology. An integrated circuit 11 is formed on a top surface 101 of a silicon semiconductor wafer 10. A stress balance layer 12 is formed on a bottom surface 102 of the silicon semiconductor wafer 10 for balancing the stress which is accumulated during the process of forming the integrated circuit 11 and suffered by the silicon semiconductor wafer 10.

In the application of compound semiconductor devices, growing multiple layers of epitaxial structure is needed during the formation of the integrated circuits on the compound semiconductor wafer. Comparing to forming silicon based integrated circuits on a silicon semiconductor wafer, usually the compound semiconductor wafer is suffered much more stress than the silicon semiconductor wafer. However, the conventional technology does not disclose the stress balance structure which can effectively balance the stress suffered by a compound semiconductor wafer. Furthermore, for some certain application of compound semiconductor devices, it is required to form a metal layer or to form an ohmic electrode on a bottom surface of a compound semiconductor wafer. The improved structure for silicon semiconductor wafer of the conventional technology could not meet the requirement.

Accordingly, the present invention has developed a new design which could avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is: how to form an improved structure which comprises at least one stress balance layer and a metal layer on a bottom surface of a compound semiconductor wafer so that the improved structure has both the functions of stress balance and electrical conductivity.

In order to solve the problems mentioned the above and to achieve the expected effect, the present invention provides an improved structure for reducing compound semiconductor wafer distortion comprising a contact metal layer, at least one stress balance layer and a die attachment layer. The contact metal layer is formed on a bottom surface of a compound semiconductor wafer. The at least one stress balance layer is formed on a bottom surface of the contact metal layer, wherein the at least one stress balance layer is made of at least one conductive material. The die attachment layer is formed on a bottom surface of the at least one stress balance layer, wherein the die attachment layer is made of conductive material. By locating the at least one stress balance layer between the contact metal layer and the die attachment layer, the stress suffered by the compound semiconductor wafer is balanced so that the distortion of the compound semiconductor wafer is reduced. The contact metal layer, the at least one stress balance layer and the die attachment layer are all made of conductive materials, therefore, the improved structure for reducing compound semiconductor wafer distortion has both the functions of stress balance and electrical conductivity.

In an embodiment of the improved structure for reducing compound semiconductor wafer distortion, an ohmic contact is formed between the contact metal layer and the bottom surface of the compound semiconductor wafer so that the contact metal layer forms an ohmic electrode.

In an embodiment of the improved structure for reducing compound semiconductor wafer distortion, the ohmic electrode is used for at least one diode, wherein the at least one diode is at least one selected from the group consisting of: a PN diode, a Schottky diode, a light-emitting diode, a laser diode, a vertical-cavity surface-emitting laser diode, a photodiode, a varicap diode, a current regulative diode, and a Zener diode.

In an embodiment of the improved structure for reducing compound semiconductor wafer distortion, the compound semiconductor wafer has a thickness greater than or equal to 25 μm and less than or equal to 350 μm.

In an embodiment of the improved structure for reducing compound semiconductor wafer distortion, the compound semiconductor wafer has a diameter greater than or equal to 3 inches.

In an embodiment of the improved structure for reducing compound semiconductor wafer distortion, the compound semiconductor wafer is made by one material selected from the group consisting of: GaAs, sapphire, InP, GaP. SiC, GaN, AlN, ZnSe, InAs, and GaSb.

In an embodiment of the improved structure for reducing compound semiconductor wafer distortion, the contact metal layer is made by at least one material selected from the group consisting of: Pd, Ge, Ni, Ti, Pt, Au, and Ag.

In an embodiment of the improved structure for reducing compound semiconductor wafer distortion, each of the at least one stress balance layer is made by metal or metal alloy.

In an embodiment of the improved structure for reducing compound semiconductor wafer distortion, each of the at least one stress balance layer is made by at least one material selected from the group consisting of: Ti or Ti alloy, W or W alloy, Au or Au alloy, TiW alloy, TiWN alloy, and WN alloy.

In an embodiment of the improved structure for reducing compound semiconductor wafer distortion, the at least one stress balance layer is formed on the bottom surface of the contact metal layer by sputtering or electroplating.

In an embodiment of the improved structure for reducing compound semiconductor wafer distortion, the die attachment layer is made by at least one material selected from the group consisting of: Au or Au alloy, Ag or Ag alloy, Sn or Sn alloy, and silver conductive epoxy adhesive.

In an embodiment of the improved structure for reducing compound semiconductor wafer distortion, the at least one stress balance layer has a thickness greater than or equal to 50 nm and less than or equal to 5 μm.

In an embodiment of the improved structure for reducing compound semiconductor wafer distortion, a heat transfer coefficient of the at least one stress balance layer is greater than or equal to 10 W/m-K.

For further understanding the characteristics and effects of the present invention, some preferred embodiments referred to drawings are in detail described as follows.

BRIEF DESCRIPTION OF DRAWINGS

FIG. 1 is a sectional schematic view of an embodiment of an improved structure for reducing compound semiconductor wafer distortion of the present invention.

FIG. 2A is a sectional schematic view of an application of an improved structure for reducing compound semiconductor wafer distortion of the present invention to vertical-cavity surface-emitting laser diodes.

DETAILED DESCRIPTIONS OF PREFERRED EMBODIMENTS

Figure 2B:
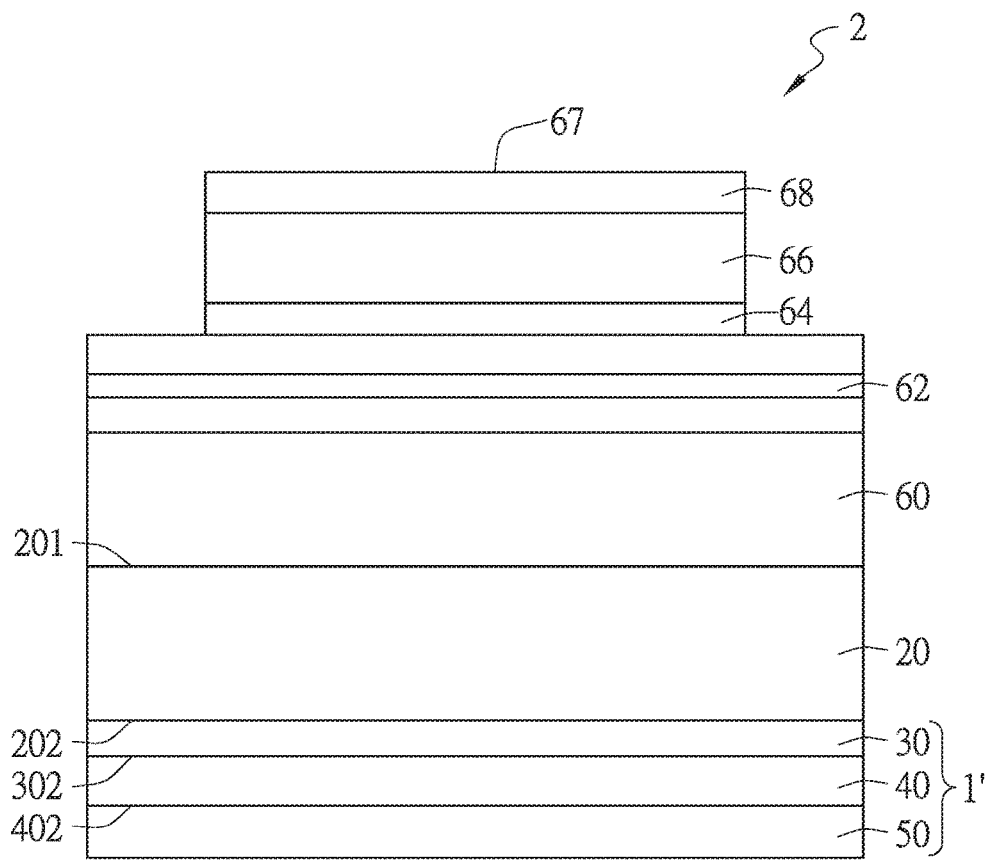
FIG. 2B is a sectional schematic view of an application of an improved structure for reducing compound semiconductor wafer distortion of the present invention to a vertical-cavity surface-emitting laser diode.
Figure 3:
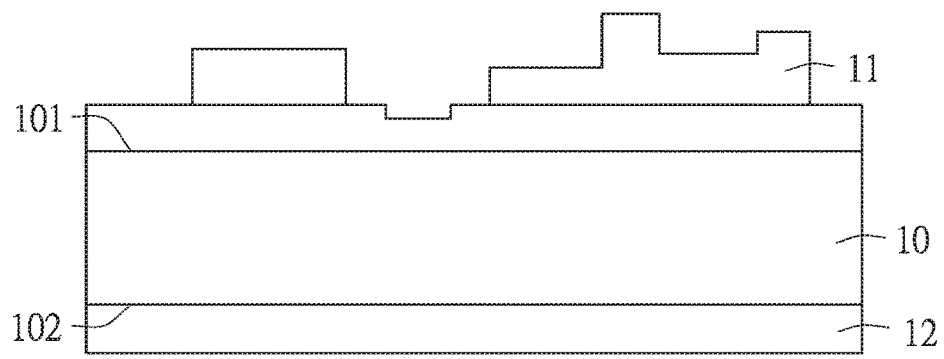
FIG. 3 is a sectional schematic view of an improved structure for silicon semiconductor wafer of conventional technology.

Please refer to FIG. 1, which is a sectional schematic view of an embodiment of an improved structure for reducing compound semiconductor wafer distortion of the present invention. The improved structure 1 for reducing compound semiconductor wafer distortion of the present invention comprises a contact metal layer 30, at least one stress balance layer 40 and a die attachment layer 50. The contact metal layer 30 is formed on a bottom surface 202 of a compound semiconductor wafer 20, wherein the compound semiconductor wafer 20 has a top surface 201 and the bottom surface 202. The material of the compound semiconductor wafer 20 may be one selected from the group consisting of: GaAs, sapphire, InP, GaP, SiC, GaN, AlN, ZnSe, InAs, and GaSb. The compound semiconductor wafer 20 has a thickness greater than or equal to 25 μm and less than or equal to 350 μm. In some preferable embodiments, the compound semiconductor wafer 20 has a diameter greater than or equal to 3 inches. Since the larger diameter of the compound semiconductor wafer 20 will cause the distortion of the compound semiconductor wafer 20 more seriously. Therefore, the effect of reducing the distortion of the compound semiconductor wafer 20 is more significant when the improved structure 1 for reducing compound semiconductor wafer distortion of the present invention is applied to the compound semiconductor wafer 20 which has a diameter greater than or equal to 3 inches. The material of the contact metal layer 30 is at least one selected from the group consisting of: Pd, Ge, Ni, Ti, Pt, Au, and Ag. The stress balance layer 40 is formed on a bottom surface 302 of the contact metal layer 30. The stress balance layer 40 is made of at least one conductive material. The stress balance layer 40 is formed on the bottom surface 302 of the contact metal layer 30 by sputtering, electroplating, vacuum evaporation, ion plating or chemical vapor deposition. In some preferable embodiments, the stress balance layer 40 is formed on the bottom surface 302 of the contact metal layer 30 by sputtering or electroplating. The stress balance layer 40 has a thickness greater than or equal to 50 nm and less than or equal to 5 μm. In some preferable embodiments, a heat transfer coefficient of the stress balance layer 40 is greater than or equal to 10 W/m-K. In some embodiments, the material of each of the at least one stress balance layer 40 is metal or metal alloy. In some preferable embodiments, the material of each of the at least one stress balance layer 40 is at least one selected from the group consisting of Ti or Ti alloy, W or W alloy, Au or Au alloy, TiW alloy, TiWN alloy, and WN alloy. The die attachment layer 50 is formed on a bottom surface 402 of the stress balance layer 40. The die attachment layer 50 is made of conductive material. The material of the die attachment layer 50 is at least one selected from the group consisting of: Au or Au alloy, Ag or Ag alloy, Sn or Sn alloy, and silver conductive epoxy adhesive. By locating the at least one stress balance layer 40 between the contact metal layer 30 and the die attachment layer 50, the stress suffered by the compound semiconductor wafer 20 is balanced so that the distortion of the compound semiconductor wafer 20 is reduced. Since the contact metal layer 30, the stress balance layer 40 and the die attachment layer 50 are all made of conductive materials, therefore the improved structure 1 for reducing compound semiconductor wafer distortion of the present invention not only can balance the stress suffered by the compound semiconductor wafer 20 to reduce the distortion of the compound semiconductor wafer 20, but the improved structure 1 also have the function of conducting to meet the requirements of some specific applications. According to the stress suffered by the compound semiconductor wafer 20, the improved structure 1 for reducing compound semiconductor wafer distortion of the present invention may choose appropriate materials and thicknesses (including the contact metal layer 30, the stress balance layer 40 and the die attachment layer 50) to balance the stress of the structure formed on the top surface 201 of the compound semiconductor wafer 20.

In some preferable embodiments, the material of the compound semiconductor wafer 20 is one selected from the group consisting of: GaAs, sapphire, InP, GaP, SiC, GaN and AlN. In some preferable embodiments, the material of the contact metal layer 30 is at least one selected from the group consisting of: Pd, Ge, Ni, Ti, Pt, Au, and Ag. In some preferable embodiments, the material of each of the at least one stress balance layer 40 is at least one selected from the group consisting of: Ti or Ti alloy, W or W alloy, Au or Au alloy and TiW alloy. In some preferable embodiments, the material of the die attachment layer 50 is Au or Au alloy.

In some preferable embodiments, the thickness of the compound semiconductor wafer 20 is greater than or equal to 25 μm and less than or equal to 350 μm, greater than or equal to 35 μm and less than or equal to 350 μm, greater than or equal to 50 μm and less than or equal to 350 μm, greater than or equal to 75 μm and less than or equal to 350 μm, greater than or equal to 100 μm and less than or equal to 350 μm, greater than or equal to 25 μm and less than or equal to 300 μm, greater than or equal to 25 μm and less than or equal to 250 μm, greater than or equal to 25 μm and less than or equal to 200 μm, greater than or equal to 25 μm and less than or equal to 150 μm, or greater than or equal to 25 μm and less than or equal to 100 μm. In some preferable embodiments, the thickness of the stress balance layer 40 is greater than or equal to 50 nm and less than or equal to 5 μm, greater than or equal to 75 nm and less than or equal to 5 μm, greater than or equal to 100 nm and less than or equal to 5 μm, greater than or equal to 150 nm and less than or equal to 5 μm, greater than or equal to 200 nm and less than or equal to 5 μm, greater than or equal to 250 nm and less than or equal to 5 μm greater than or equal to 50 nm and less than or equal to 4.5 μm, greater than or equal to 50 nm and less than or equal to 4 μm, greater than or equal to 50 nm and less than or equal to 3.5 μm, or greater than or equal to 50 nm and less than or equal to 3 μm.

Please refer to FIG. 2A, which is a sectional schematic view of an application of an improved structure for reducing compound semiconductor wafer distortion of the present invention to vertical-cavity surface-emitting laser diodes, wherein the improved structure 1' for reducing compound semiconductor wafer distortion of the present invention is applied to form a plurality of vertical-cavity surface-emitting laser diodes 2. In the embodiment of FIG. 2A, the improved structure 1' for reducing compound semiconductor wafer distortion of the present invention comprises a contact metal layer 30, at least one stress balance layer 40 and a die attachment layer 50. The contact metal layer 30 is formed on a bottom surface 202 of a compound semiconductor wafer 20. The stress balance layer 40 is formed on a bottom surface 302 of the contact metal layer 30. The die attachment layer 50 is formed on a bottom surface 402 of the stress balance layer 40. The improved structure 1' for reducing compound semiconductor wafer distortion of embodiment of FIG. 2A is basically the same as the improved structure 1 of the embodiment of FIG. 1, except that an ohmic contact is formed between the contact metal layer 30 and the bottom surface 202 of the compound semiconductor wafer 20 so that the contact metal layer 30 forms an ohmic electrode. In current embodiment, the ohmic electrode is an n-type ohmic electrode. In the embodiment of FIG. 2A, it further comprises: an n-type distributed Bragg reflector 60, a quantum well structure 62, an oxidation confinement layer 64, a p-type distributed Bragg reflector 66, a p-type ohmic electrode 68, a plurality of mesa structures 67 and a plurality recesses 69. The n-type distributed Bragg reflector 60 is formed on a top surface 201 of the compound semiconductor wafer 20. The quantum well structure 62 is formed on the n-type distributed Bragg reflector 60. The oxidation confinement layer 64 is formed on the quantum well structure 62. The p-type distributed Bragg reflector 66 is formed on the oxidation confinement layer 64. The p-type ohmic electrode 68 is formed on the p-type distributed Bragg reflector 66. The plurality of recesses 69 is formed by etching the p-type ohmic electrode 68, the p-type distributed Bragg reflector 66 and the oxidation confinement layer 64 within the area of the plurality of recesses 69. Thereby the plurality of mesa structures 67 is formed. Each mesa structure 67 includes the p-type ohmic electrode 68, the p-type distributed Bragg reflector 66 and the oxidation confinement layer 64. Please also refer to FIG. 2B, which is a sectional schematic view of an application of an improved structure for reducing compound semiconductor wafer distortion of the present invention to a vertical-cavity surface-emitting laser diode. By cutting the structure of FIG. 2A along the dashed lines 70, a plurality of vertical-cavity surface-emitting laser diodes 2 as shown in FIG. 2B is produced. Each vertical-cavity surface-emitting laser diode 2 comprises the die attachment layer 50, the stress balance layer 40, the contact metal layer 30 (n-type ohmic electrode), the compound semiconductor wafer 20, the n-type distributed Bragg reflector 60, the quantum well structure 62, the oxidation confinement layer 64, the p-type distributed Bragg reflector 66, the p-type ohmic electrode 68 and one mesa structure 67.

In some embodiments, the improved structure 1' for reducing compound semiconductor wafer distortion of the present invention (an ohmic contact is formed between the contact metal layer 30 and the bottom surface 202 of the compound semiconductor wafer 20 so that the contact metal layer 30 forms an ohmic electrode), the ohmic electrode formed by the contact metal layer 30 may be applied to the vertical-cavity surface-emitting laser diode 2 as shown in FIG. 2A and besides may also be applied to at least one selected from the group consisting of: a PN diode, a Schottky diode, a light-emitting diode, a laser diode, a photodiode, a varicap diode, a current regulative diode, and a Zener diode.

As disclosed in the above description and attached drawings, the present invention can provide an improved structure for reducing compound semiconductor wafer distortion. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An improved structure for reducing compound semiconductor wafer distortion, comprising:
    a contact metal layer formed on a bottom surface of a compound semiconductor wafer;
    at least one stress balance layer formed on a bottom surface of said contact metal layer, wherein said at least one stress balance layer is made of at least one conductive material; and
    a die attachment layer formed on a bottom surface of said at least one stress balance layer, wherein said die attachment layer is made of conductive material;
    wherein the stress suffered by said compound semiconductor wafer is balanced by locating said at least one stress balance layer between said contact metal layer and said die attachment layer, so that the distortion of said compound semiconductor wafer is reduced.

2. The improved structure for reducing compound semiconductor wafer distortion according to claim 1, wherein an ohmic contact is formed between said contact metal layer and said bottom surface of said compound semiconductor wafer so that said contact metal layer forms an ohmic electrode.

3. The improved structure for reducing compound semiconductor wafer distortion according to claim 2, wherein said ohmic electrode is used for at least one diode, wherein said at least one diode is at least one selected from the group consisting of: a PN diode, a Schottky diode, a light-emitting diode, a laser diode, a vertical-cavity surface-emitting laser diode, a photodiode, a varicap diode, a current regulative diode, and a Zener diode.

4. The improved structure for reducing compound semiconductor wafer distortion according to claim 1, wherein said compound semiconductor wafer has a thickness greater than or equal to 25 μm and less than or equal to 350 μm.

5. The improved structure for reducing compound semiconductor wafer distortion according to claim 1, wherein said compound semiconductor wafer has a diameter greater than or equal to 3 inches.

6. The improved structure for reducing compound semiconductor wafer distortion according to claim 1, wherein said compound semiconductor wafer is made by one material selected from the group consisting of: GaAs, sapphire, InP, GaP, SiC, GaN, AlN, ZnSe, InAs, and GaSb.

7. The improved structure for reducing compound semiconductor wafer distortion according to claim 1, wherein said contact metal layer is made by at least one material selected from the group consisting of: Pd, Ge, Ni, Ti, Pt, Au, and Ag.

8. The improved structure for reducing compound semiconductor wafer distortion according to claim 1, wherein each of said at least one stress balance layer is made by metal or metal alloy.

9. The improved structure for reducing compound semiconductor wafer distortion according to claim 8, wherein each of said at least one stress balance layer is made by at least one material selected from the group consisting of: Ti or Ti alloy, W or W alloy, Au or Au alloy, TiW alloy, TiWN alloy, and WN alloy.

10. The improved structure for reducing compound semiconductor wafer distortion according to claim 8, wherein said at least one stress balance layer is formed on said bottom surface of said contact metal layer by sputtering or electroplating.

11. The improved structure for reducing compound semiconductor wafer distortion according to claim 1, wherein said die attachment layer is made by at least one material selected from the group consisting of: Au or Au alloy, Ag or Ag alloy, Sn or Sn alloy, and silver conductive epoxy adhesive.

12. The improved structure for reducing compound semiconductor wafer distortion according to claim 1, wherein said at least one stress balance layer has a thickness greater than or equal to 50 nm and less than or equal to 5 μm.

13. The improved structure for reducing compound semiconductor wafer distortion according to claim 1, wherein a heat transfer coefficient of said at least one stress balance layer is greater than or equal to 10 W/m-K.

* * * * *